United States Patent
Chen et al.

(10) Patent No.: US 9,625,959 B1
(45) Date of Patent: Apr. 18, 2017

(54) TOP-LOAD HDD SERVER

(71) Applicant: Super Micro Computer Inc., San Jose, CA (US)

(72) Inventors: Richard S. Chen, San Jose, CA (US); Chaoching Wu, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 15/058,611

(22) Filed: Mar. 2, 2016

(51) Int. Cl.
| | |
|---|---|
| H05K 5/02 | (2006.01) |
| H05K 7/18 | (2006.01) |
| G06F 1/18 | (2006.01) |
| G06F 1/20 | (2006.01) |

(52) U.S. Cl.
CPC .............. G06F 1/187 (2013.01); G06F 1/184 (2013.01); G06F 1/20 (2013.01)

(58) Field of Classification Search
CPC .......... G06F 1/187; G06F 1/188; G06F 1/184; G06F 1/183; H05K 7/1487; H05K 7/1488; H05K 7/1489; H05K 7/1492
See application file for complete search history.

(56) References Cited

U.S. PATENT DOCUMENTS

| | | | | |
|---|---|---|---|---|
| 2008/0253077 | A1* | 10/2008 | Miyamoto | G06F 1/187 361/679.31 |
| 2009/0231806 | A1* | 9/2009 | Lee | G06F 1/181 361/679.58 |
| 2010/0172083 | A1* | 7/2010 | Randall | G11B 33/126 361/679.31 |
| 2011/0194242 | A1* | 8/2011 | Hu | H05K 7/1487 361/679.32 |
| 2012/0026710 | A1* | 2/2012 | Li | G06F 1/188 361/803 |
| 2013/0102237 | A1* | 4/2013 | Zhou | G06F 1/189 454/184 |
| 2016/0085276 | A1* | 3/2016 | Lieber | G06F 1/187 361/679.31 |
| 2016/0224076 | A1* | 8/2016 | Song | G06F 1/187 |

* cited by examiner

*Primary Examiner* — Courtney Smith
*Assistant Examiner* — Christopher L Augustin
(74) *Attorney, Agent, or Firm* — Chun-Ming Shih; HDLS IPR Services

(57) ABSTRACT

The present disclosure provides a top-load HDD server including: a partition plate arranged in a containing space of a case to divide the containing space into a plurality of hard disk chambers and a system chamber; a mother board arranged at a bottom of the system chamber; a power supply frame including a power control board and a power carrier; the power carrier includes a movable frame and a fixed frame, the movable frame is arranged on the power control board and removable, and thereby improves cable management and maintenance.

10 Claims, 10 Drawing Sheets

TOP-LOAD HDD SERVER

BACKGROUND OF THE INVENTION

Field of the Invention

The present disclosure is related to a storage server, and particularly related to a top-load HDD (Hard Disk Drive) server.

Description of the Related Art

In recent years, under cloud system topics, carrying space capacity of server storage resource has become another development indicator and it has also indirectly created concepts of high-capacity storage server (Storage Enhancement).

Generally, factors such as storage capacity (quantity of hard disks), depth of racks, opening direction, power supply and heat dissipation efficiency should be considered while designing a high storage capacity server. In addition, after arranging multiple rows of hard disk in a server chassis, there is usually no space remained therein. Therefore, inconvenience and troubles are often caused in subsequent cable managements and maintenances, and these indeed need to be improved.

In views of this, in order to solve the above disadvantage, the present inventor studied related technology and provided a reasonable and effective solution in the present disclosure.

SUMMARY OF THE INVENTION

It is an object of the present disclosure to provide a top-load HDD (Hard Disk Drive) server to improve conveniences of cable management and maintenance.

In order to achieve the aforementioned object, a top-load HDD server for accommodating a plurality of hard disks and power supplies is provided in the present disclosure. The top-load HDD server includes a case, a mother board and a power supply frame. The case includes a plurality of support plates and a plurality of partition plates, a containing space is defined by the support plates, the partition plates are arranged in the containing space and divides the containing space into a plurality of hard disk chambers and a system chamber, and the hard disks are inserted in the hard disk chambers. The mother board is arranged at bottom in the system chamber for electrically connected with the hard disks. The power supply frame includes a power control board combined on the partition plate and a power carrier carrying the power supplies, the power control board is electrically connected with the mother board, the power carrier includes a movable frame and a fixed frame, the movable frame is combined on the power control board above the mother board and removable, and the fixed frame is fixed on the case. The power supply is inserted into the fixed frame and through the movable frame to electrically connect to the power control board.

It is another object of the present disclosure to provide a top-load HDD server, wherein first heat dissipation fans and second heat dissipations are arranged at a rear side of the case and arranged upper and lower dislocation to improve peripheral device arrangement in the server and applicability thereof. Compared with conventional servers, the top-load HDD server has movable frame, the movable frame is assembled between the power control board and the fixed frame by snapping. Therefore, the movable frame could be removed from the system chamber before cable management process or maintenance process of the server of the present disclosure, and a sufficient space is available for cable management process or maintenance process. Moreover, the first heat dissipation fans and the second heat dissipation fans of the present disclosure are arranged upper and lower dislocation. The server could further include peripheral devices, and the second heat dissipation fans could be removed before cable management process or maintenance process of the peripheral devices. Thereby, it is easy to install peripheral devices, and applicability of the present disclosure is improved.

DETAILED DESCRIPTION OF EMBODIMENT

Figure 1:
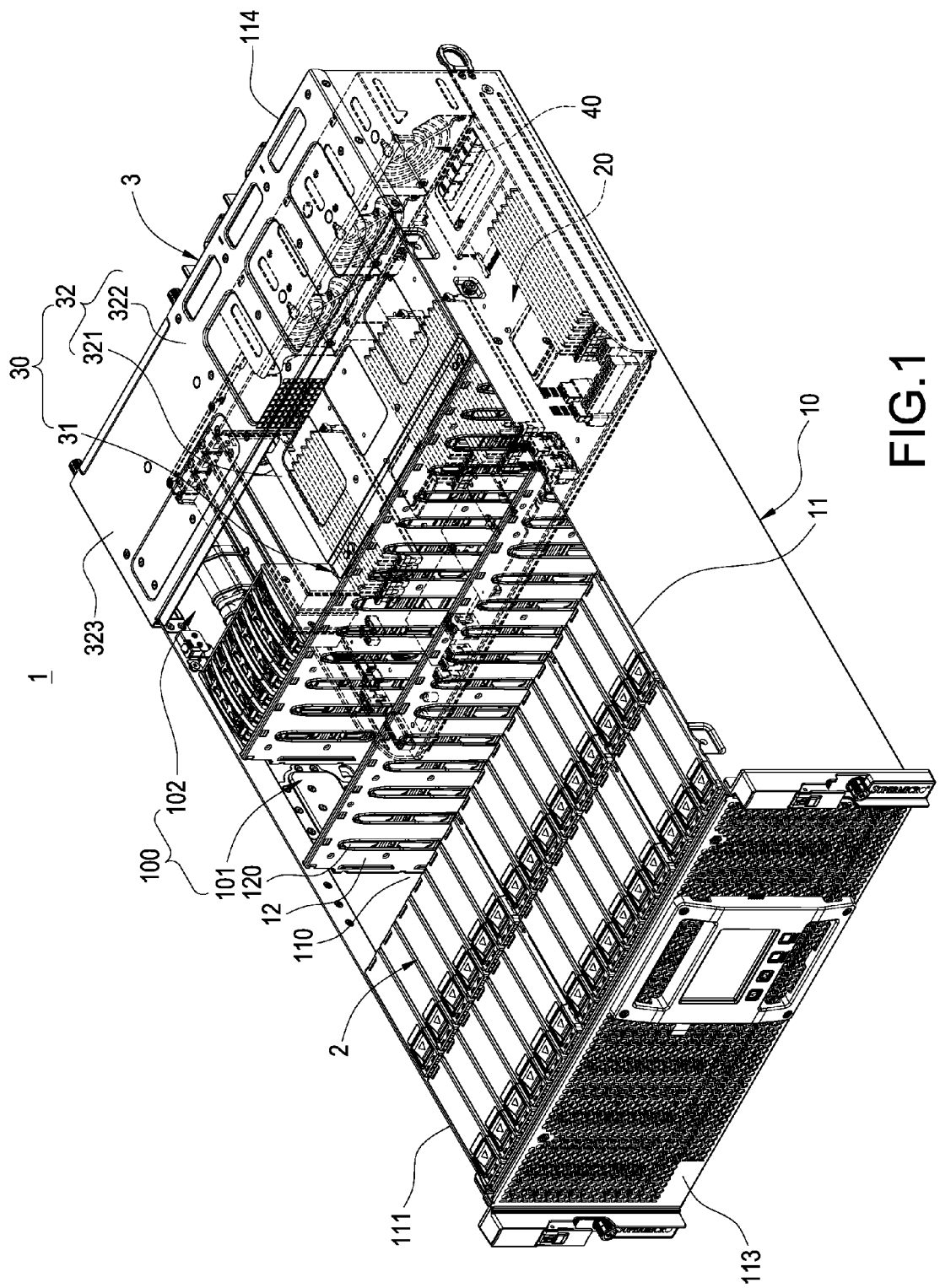
FIG. 1 is a perspective view showing a side of the top-load HDD server of the present disclosure.

Detail descriptions and technical contents of the present disclosure are described below with drawings. However, the drawings are provided for reference and demonstration, and the present disclosure should not be limited by the drawings.

Please refer to FIG. 1-4 respectively showing perspective views from various sides, a partial exploded view and a rear view of the Top-load HDD (Hard Disk Drive) server of the present disclosure. A top-load HDD server 1 is provided for accommodating multiple hard disks 2 and multiple power supplies 3. The server 1 includes a case 10, a mother board 20 and a power supply frame 30. The mother board 20 and the power supply frame 30 are arranged in the case 10. The mother board 20 is used to control electronic operations in the server 1. The hard disks 2 are inserted in the case 10 and electrically connected to the mother board 20. The power supplies 3 are arranged on the power supply frame 30 for supplying power to the server 1 while operating.

The case 10 includes multiple support plates 11 and multiple partition plates 12. A containing space 100 is defined by the support plate 11. The partition plates 12 are arranged at interval in the containing space 100 and divide the containing space 100 into multiple hard disk chambers 101 and a system chamber 102. The hard disks 2 are inserted in the hard disk chambers 101, and the power supplies 3 are arranged in the system chamber 102.

The mother board 20 includes electronic components such as CPU or memories. The mother board 20 is used to control operations of the server 1. The mother board 20 is arranged at the bottom of the system chamber 102 for connected with the hard disk 2. Moreover, the power supply frame 30 includes a power control board 31 combined on the partition plate 12 and a power carrier 32 supporting the power supplies 3. The power control board 31 is electrically connected with the mother board 20 and connected to the power supply 3 for supplying power to the mother board 20. The power carrier 32 includes a movable frame 321 and a fixed frame 322. The movable frame 321 is arranged above the mother board 20. The movable frame 321 is combined on the power control board 31 and removable, and the fixed frame 322 is fixed on the case 10. More detail descriptions about the power carrier 32 are described below.

In the present embodiment, the case 10 includes a bottom 110 at a bottom surface of the containing space 100 and a top 111 corresponding to the bottom 110. The hard disks 2 are inserted into the hard disk chambers 2 through the top 111 of the case 10. Furthermore, the case 10 includes a front side 113 in front of the partition plates 12 and a rear side 114 corresponding to the front side 113. The hard disk chambers 101 are adjacent to the front side 113 of the case 10, and the system chamber 102 is adjacent to the rear side 114 of the case 10.

Figure 2:
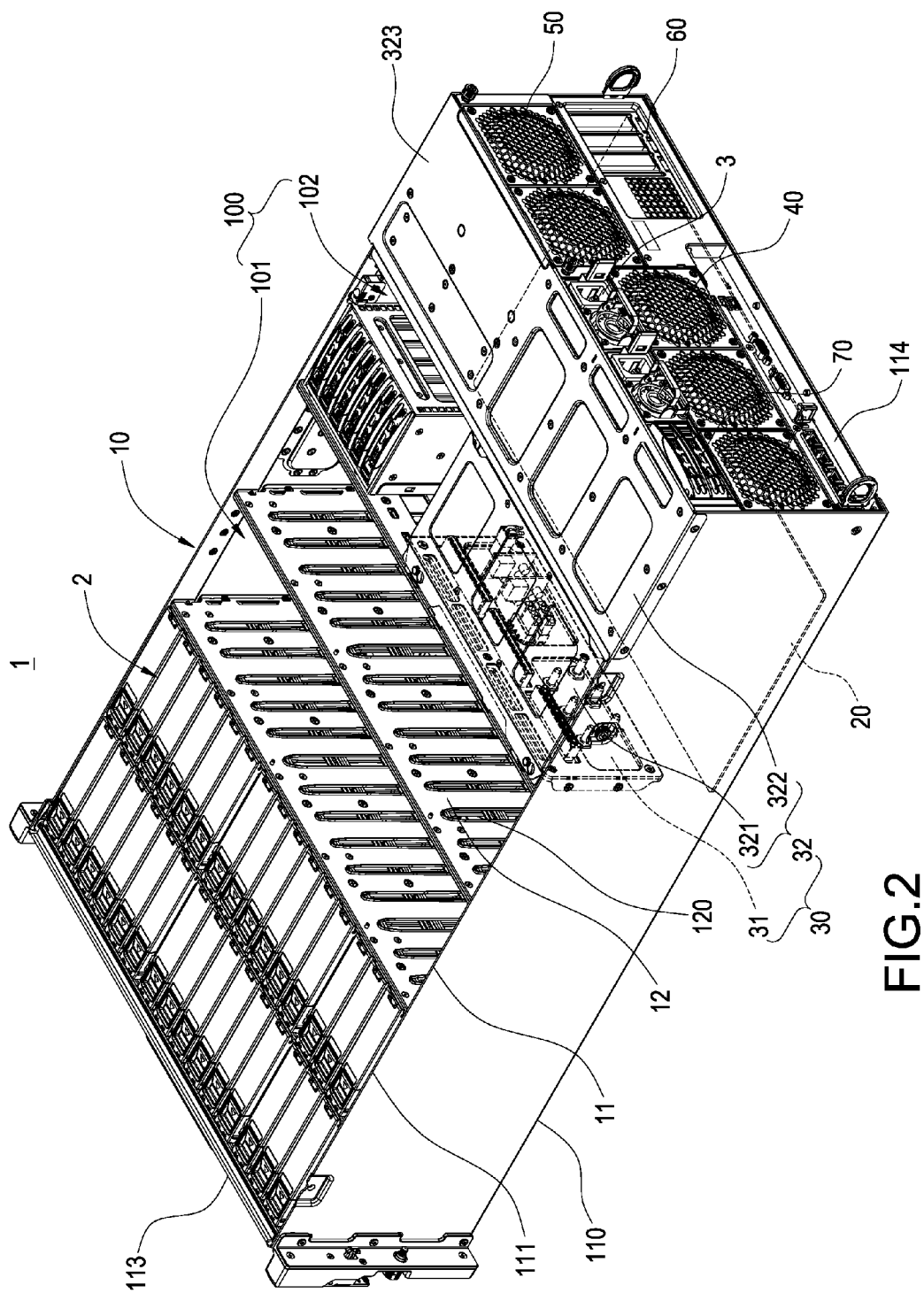
FIG. 2 is a sectional view showing another side of the top-load HDD server of the present disclosure.

Please refer to FIG. 2. The movable frame 321 and the fixed frame 322 are arranged parallel with each other, the movable frame 321 is arranged between the power control board 31 and the fixed frame 322, and the fixed frame 322 is fixed at the rear side 114 of the case 10. Moreover, each partition plate 12 has multiple heat dissipation holes 120 and the heat dissipation holes 120 are used for heat dissipation channels for dissipating heat.

Preferably, the server 1 further includes multiple first heat dissipation fans 40 and multiple second heat dissipation fans 50. The first heat dissipation fans 40 are arranged in the system chamber 102 and between the fixed frame 322 and the mother board 20. Furthermore, the second heat dissipation fans 50 are arranged in the system chamber 102 and at a side of the first heat dissipation fans 40. Moreover, an extension plate 323 is extended from a side of the fixed frame 322, the extension plate 323 covers the second heat dissipation fans 50 and above the second heat dissipation fans 50.

Figure 3:
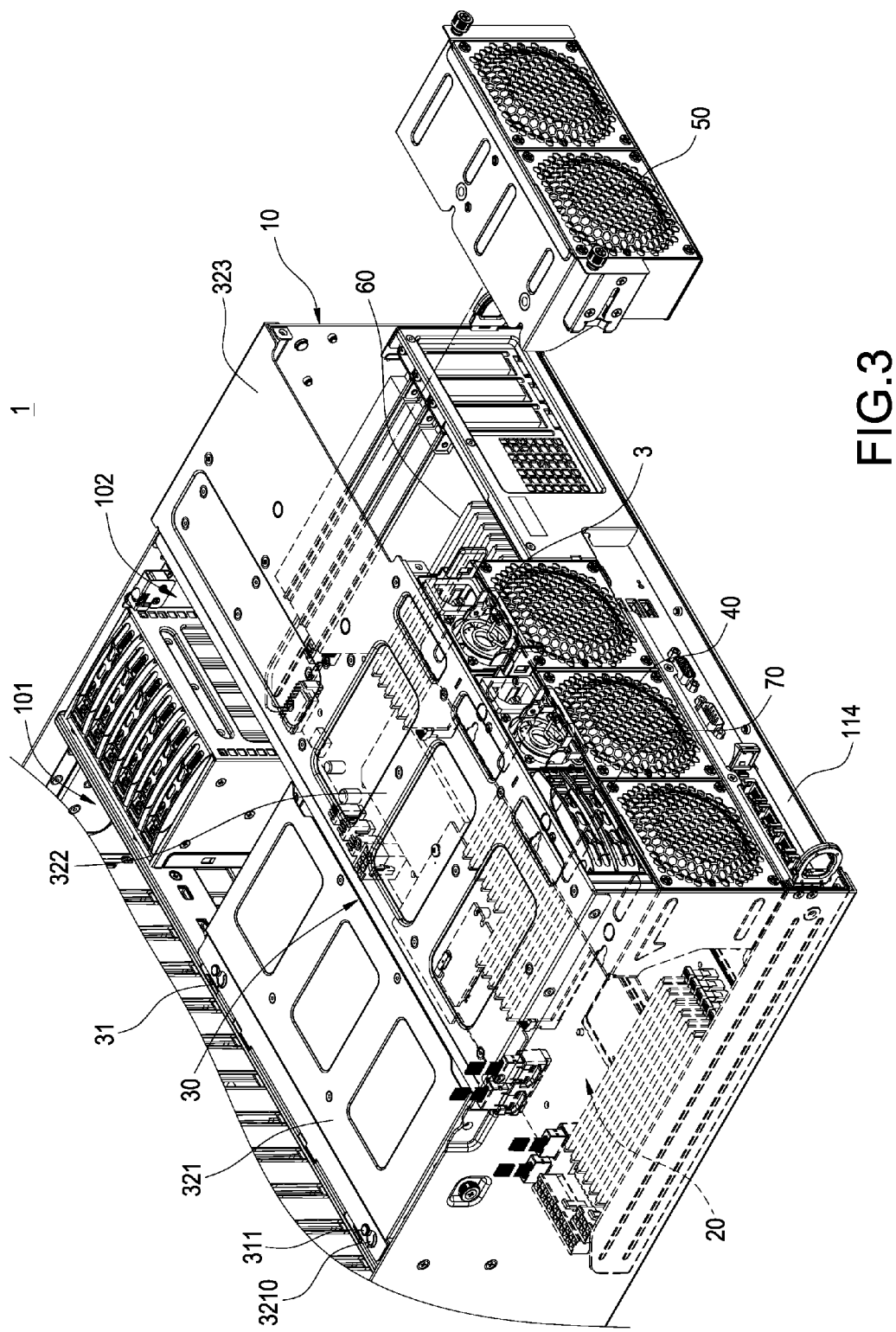
FIG. 3 is a partial exploded view of the top-load HDD server of the present disclosure.
Figure 4:
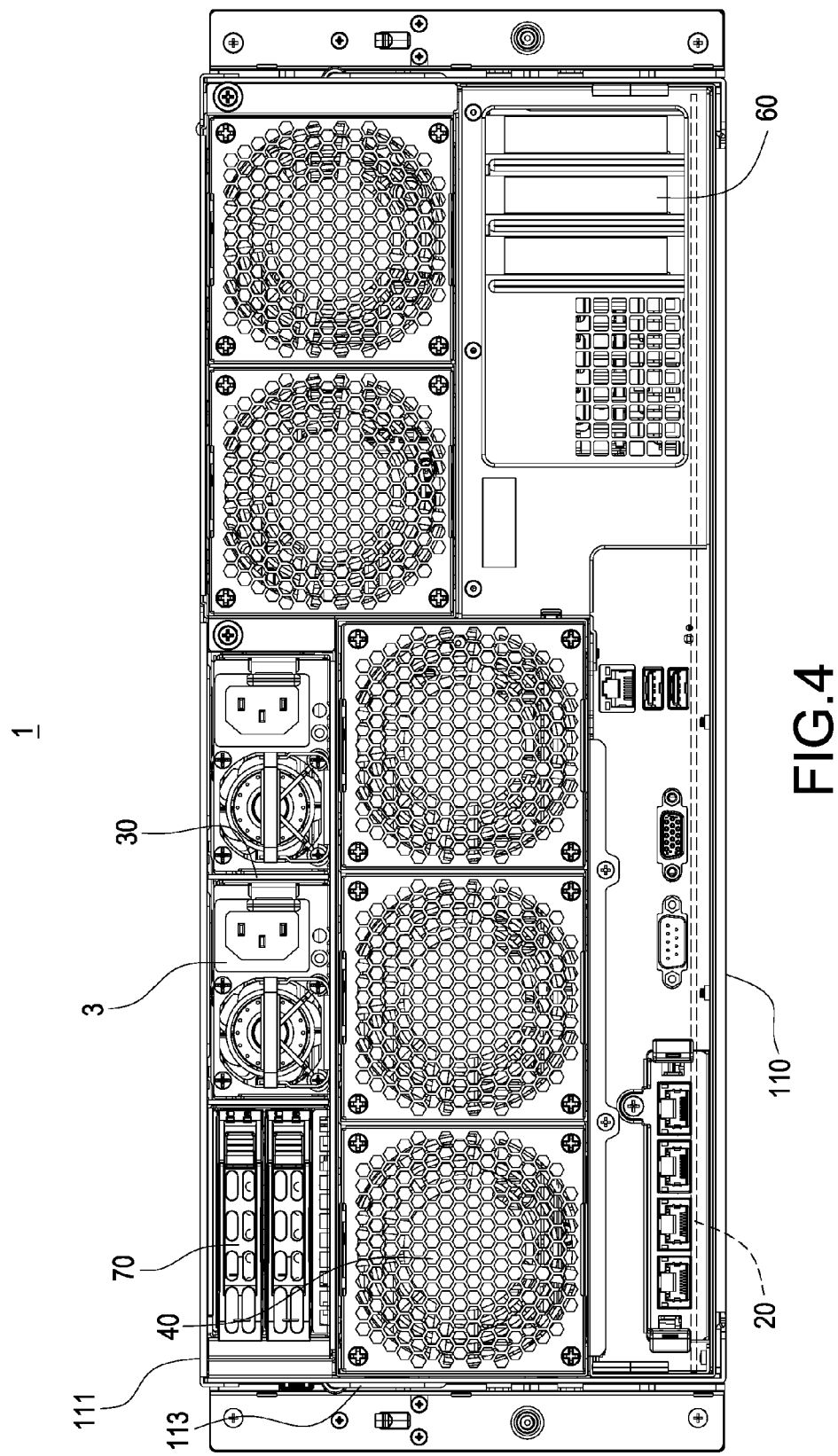
FIG. 4 is a rear view of the top-load HDD server of the present disclosure.

Please refer to FIG. 3. The first heat dissipation fans 40 and the second heat dissipation fans 50 are arranged at the rear side 114 of the case 10 and arranged upper and lower dislocation. The server 1 could further include a peripheral device 60, and the peripheral device 60 is arranged under the second heat dissipation fans 50 and electrically connected to the mother board 20.

It is necessary to be noted that the server 1 of the present disclosure further includes multiple system hard disks 70, and the system hard disks 70 are arranged in the system chamber 102, wherein amount of the system hard disks 70 are arranged on the fixed frame 322 and at a side of the power supplies 3. The system hard disks 70 are used for storing programs for installing system. Furthermore, the system hard disks 70 are electrically connected to the power control board 31, and further electrically connected to the mother board 20 via the power control board 31. Thereby, the system hard disks 70 are electrically connected with the hard disks 2 at the front side 111 of the case 10 via the mother board 20 to control operations and data transmission.

Please further refer to FIG. 5-9 which are respectively perspective views of various sides of the power supply frame of the present disclosure, and perspective view and exploded view of various sides of the removed movable frame. Please further refer to FIG. 5, the power supply 3 is inserted through the fixed frame 322 and through the movable frame 321 to electrically connect to the power control board 31.

Figure 5:
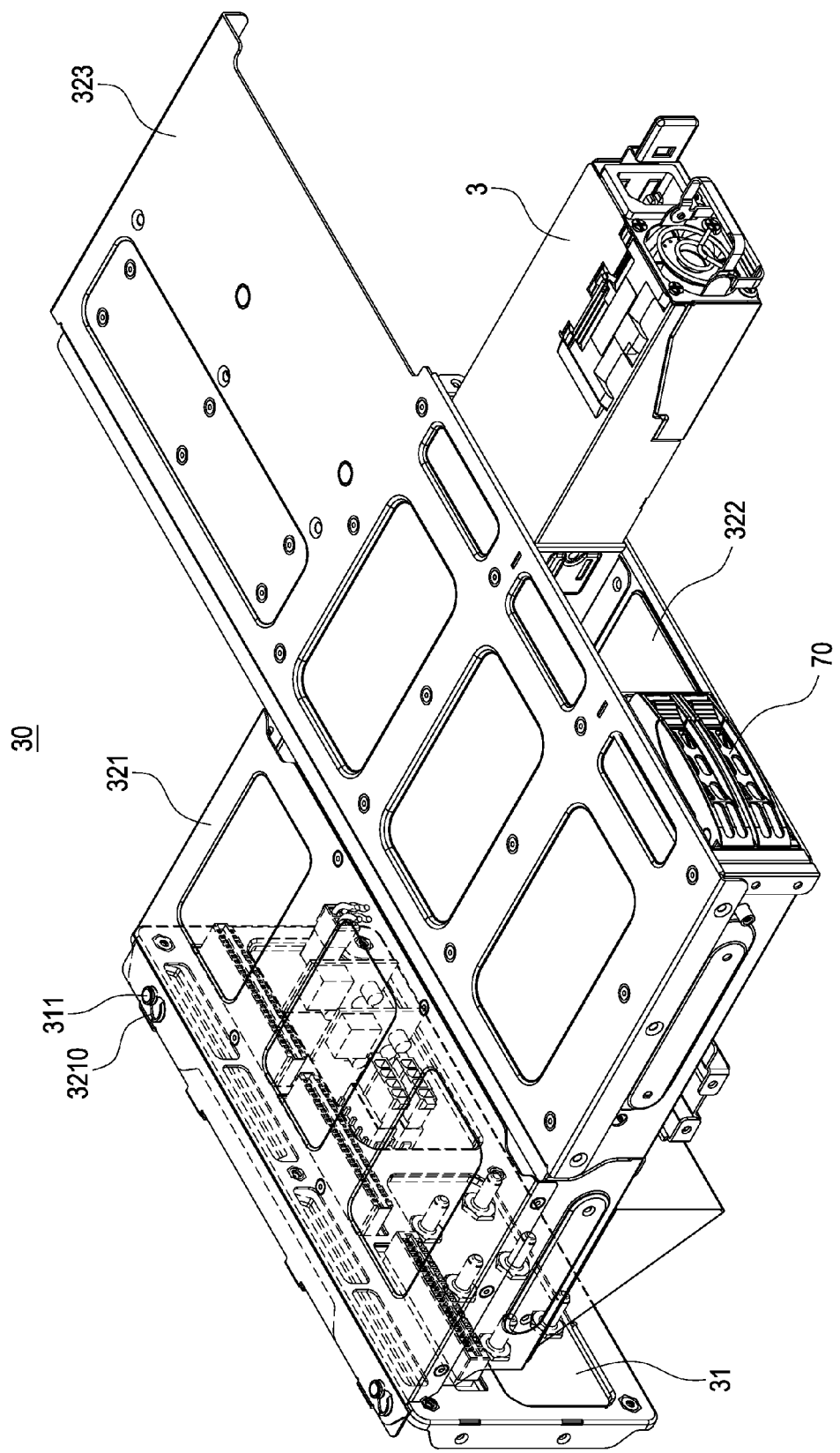
FIG. 5 is a perspective view showing a side of the top-load HDD server of the present disclosure.
Figure 6:
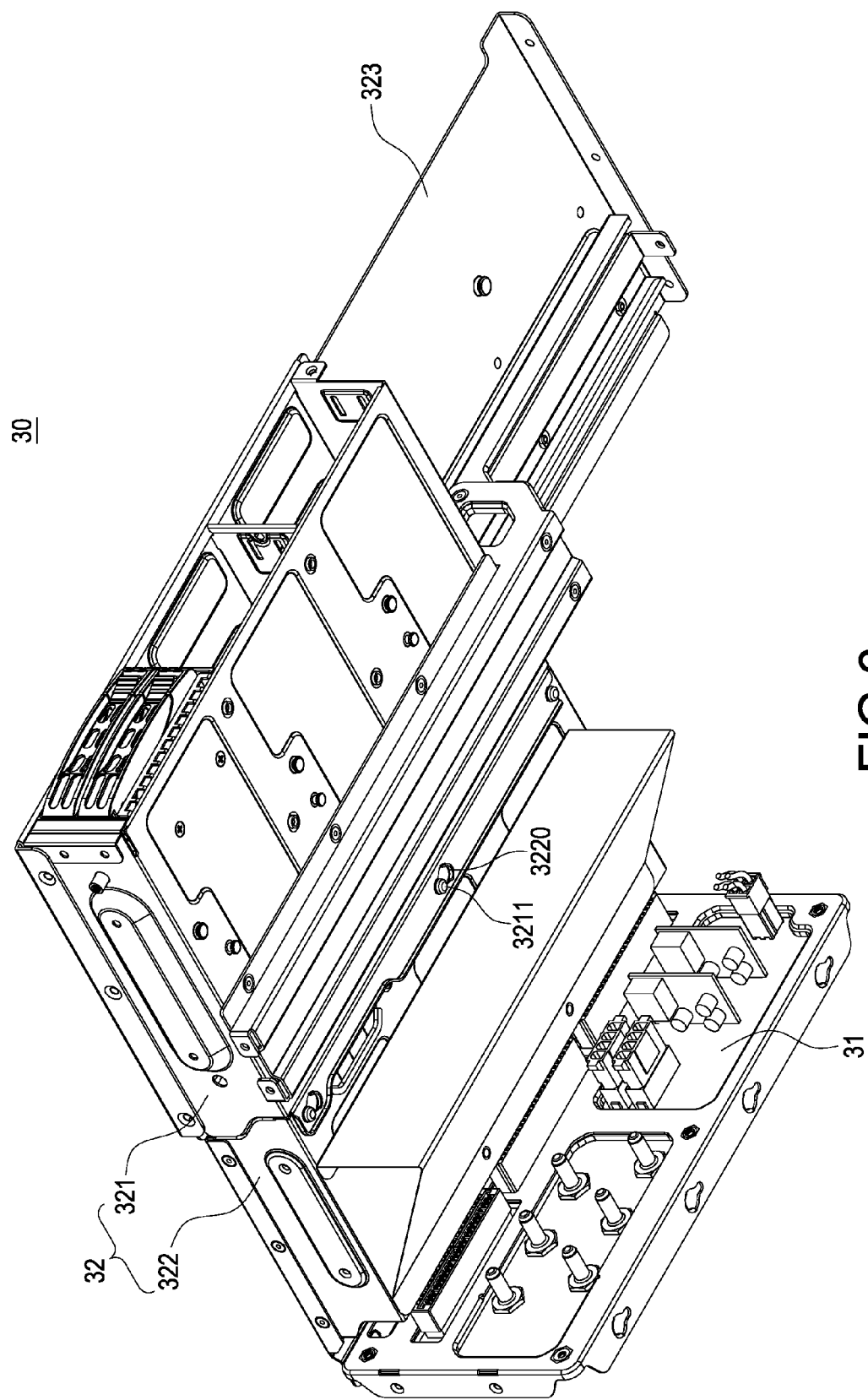
FIG. 6 is a perspective view showing another side of the top-load HDD server of the present disclosure.

Please refer to FIGS. 5 and 6, the movable frame 321 is assembled between the power control board 31 and the fixed frame 322 and removable. In an embodiment of the present disclosure, multiple first snap holes 3210 are disposed at a side of the movable frame 321 adjacent to the power control board 31, and multiple first snap columns 311 are correspondingly disposed on the power control board 31. The movable frame 321 is assembled on the power control board 31 via snapping the first snap holes 3210 with the first snap columns 311.

Moreover, multiple second snap columns 3211 are arranged at a side of the movable frame 321 adjacent to the fixed frame 322, multiple second snap holes 3220 are correspondingly disposed at a side of the fixed frame 322, the movable frame 321 is connected to the fixed frame 322 via snapping the second snap columns 3211 to the second snap holes 3220. Both sides of the movable frame 210 are respectively assembled to the power control board 31 and the fixed frame 322 by snapping. More particularly, a releasing direction which the first snap columns 311 are removed from the first snap holes 3210 is parallel with a releasing direction which the second snap columns 3211 are removed from the second snap hole 3220 parallel while the movable frame 321 is moved along a predetermined direction by an external force, the first snap columns 311 and the second snap columns 3211 could be released at the same time.

Figure 7:
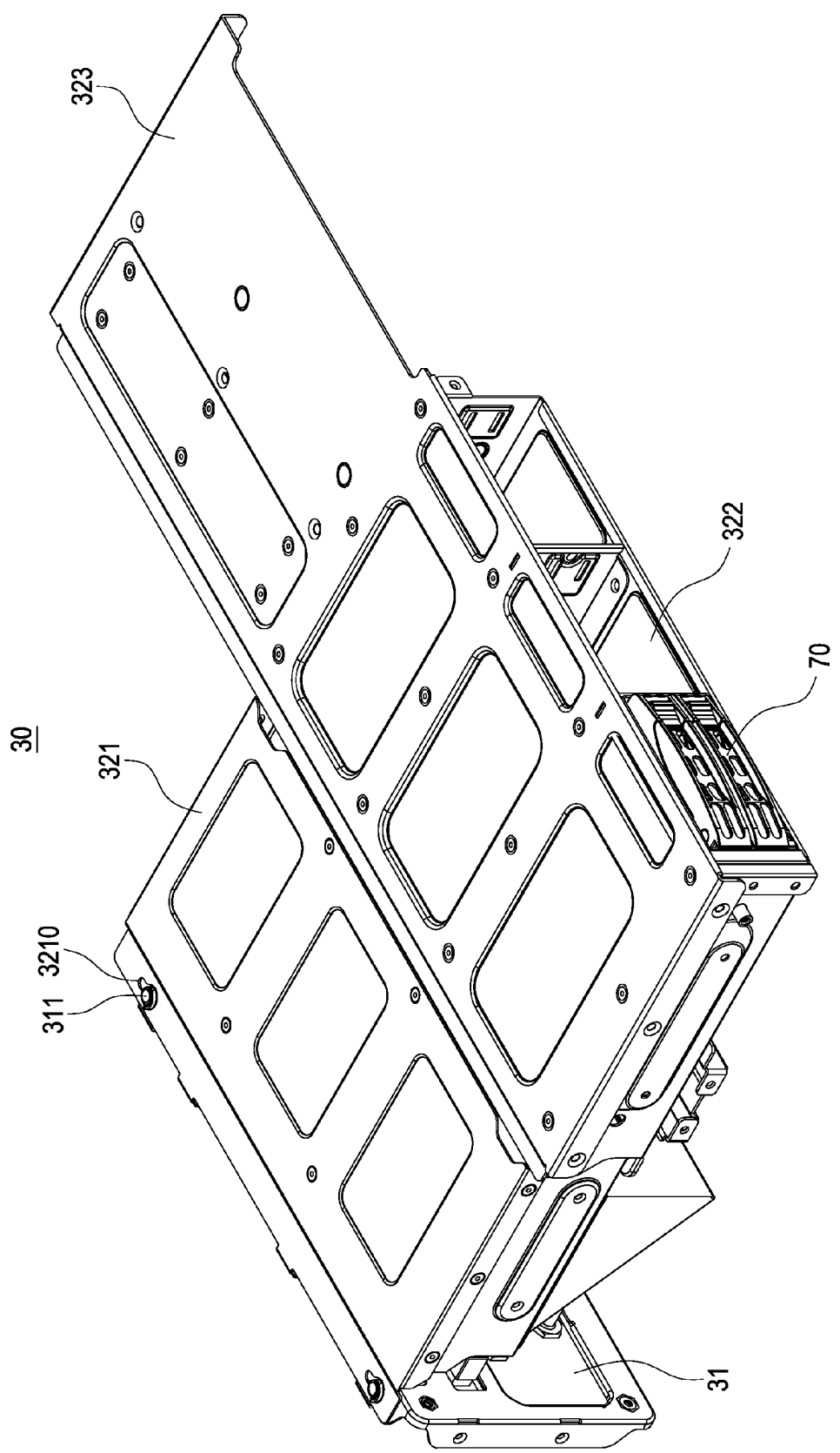
FIG. 7 is a schematic view showing a side of the removed movable frame of the present disclosure.
Figure 8:
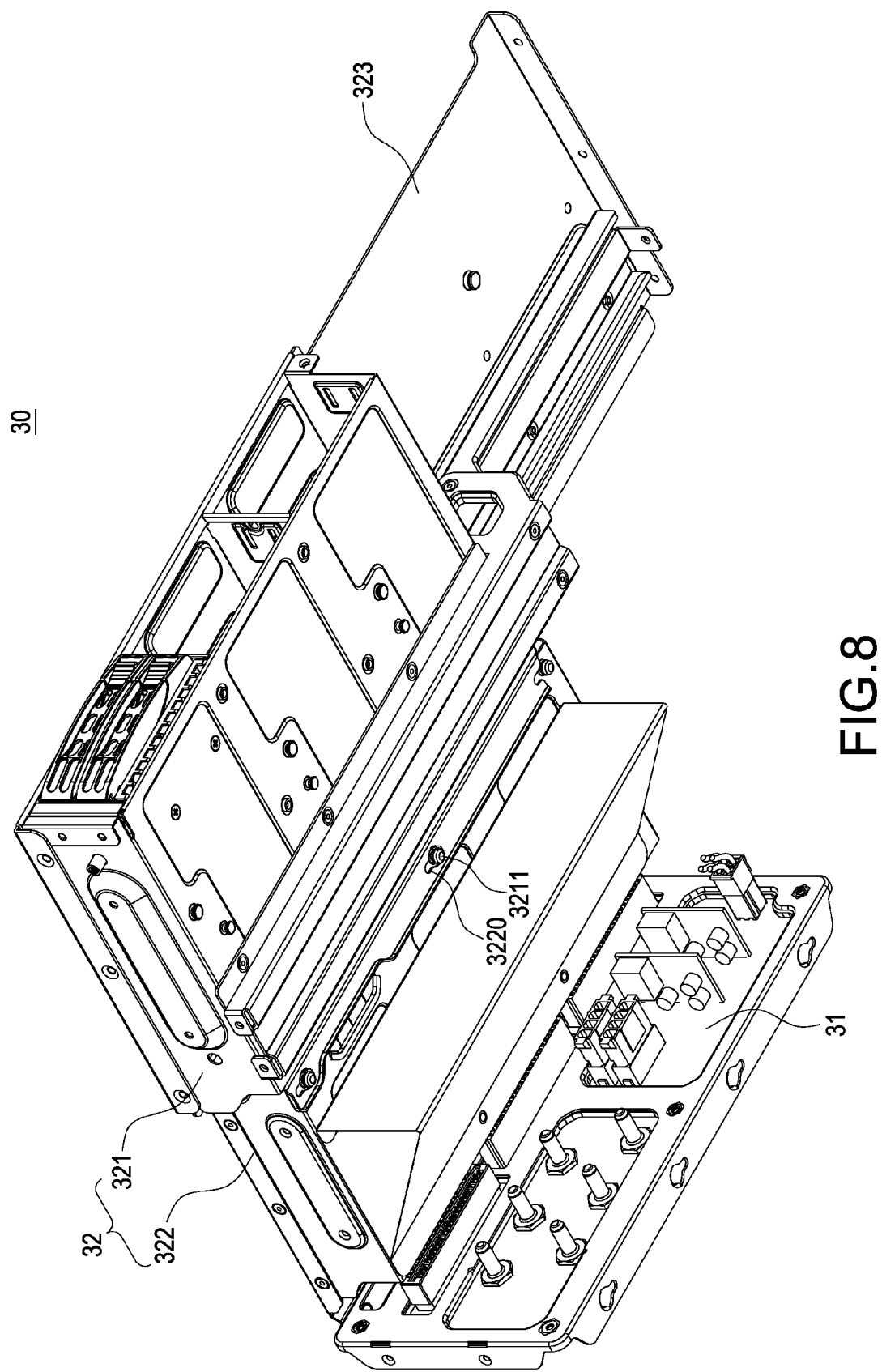
FIG. 8 is a schematic view showing another side of the removed movable frame of the present disclosure.

Please refer to FIGS. 7 and 8. The movable frame 321 of the present disclosure is able to be removed from the power control board 31 and the fixed frame 322 and thereby allow to do cable management process or maintenance process of the server 1. While removing the movable frame 321, the movable frame 321 is moved to release the first snap columns 311 from the first snap holes 3210, and the second snap columns 3211 are released from the second snap holes 3220 meanwhile.

Figure 9:
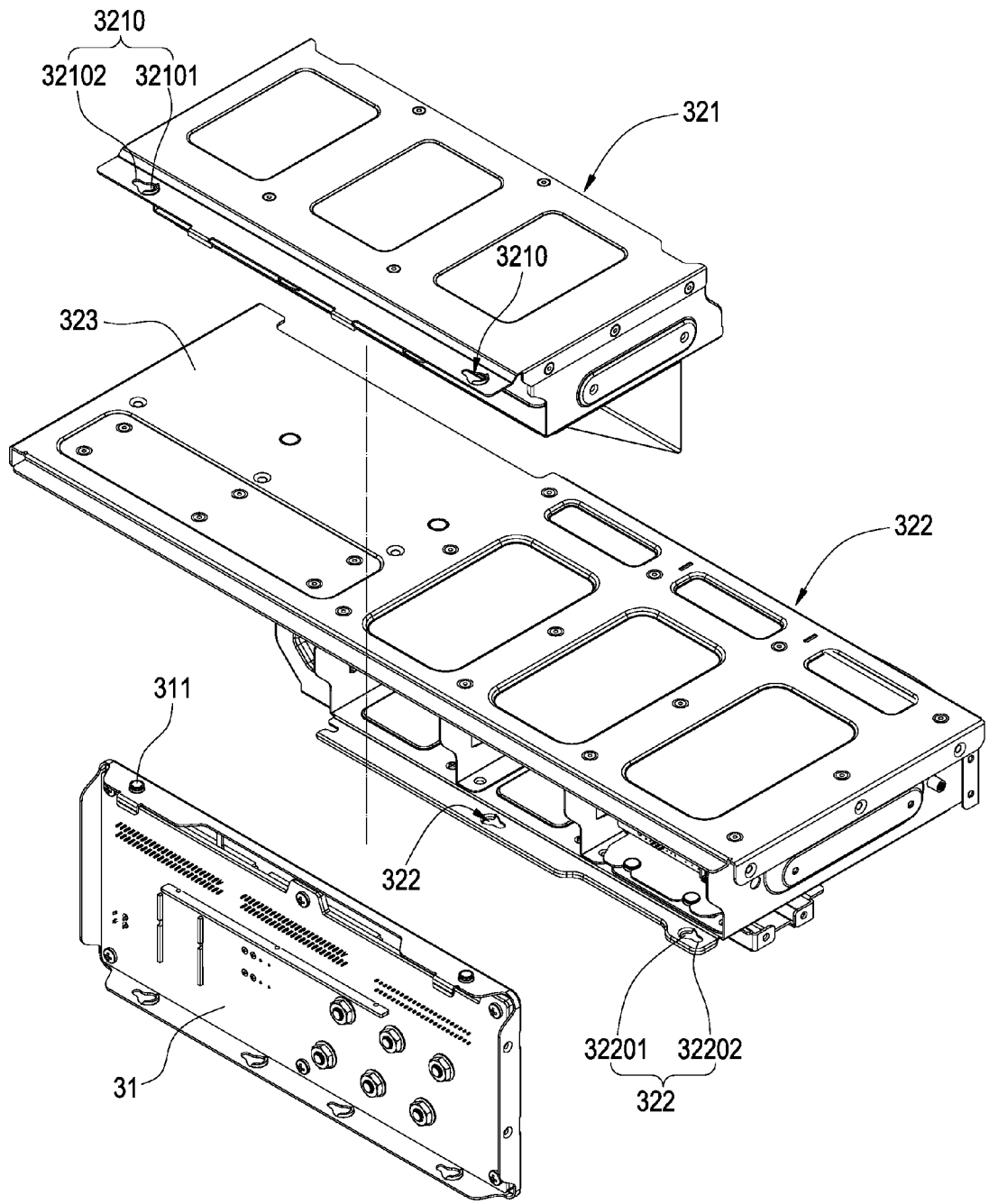
FIG. 9 is a partial exploded view of the movable frame of the present disclosure.

Please refer to FIG. 9. In the present embodiment, the first snap hole 3210 includes a first through hole 32101 and a first position hole 32102 communicated with the first through hole 32101, and the second snap hole 3220 includes a second through hole 32201 and a second position hole 32202 communicated with the second through hole 32201. Therefore, the first snap column 311 is released from the first position hole 32102 and further moved into the first through hole 32101, and the second snap column 3211 is released from the second position hole 32202 and further moved into the second through hole 32201. Thereby, both sides of the movable frame 321 are respectively released from the power control board 31 and the fixed frame 322, and allowed to be removed.

Figure 10:
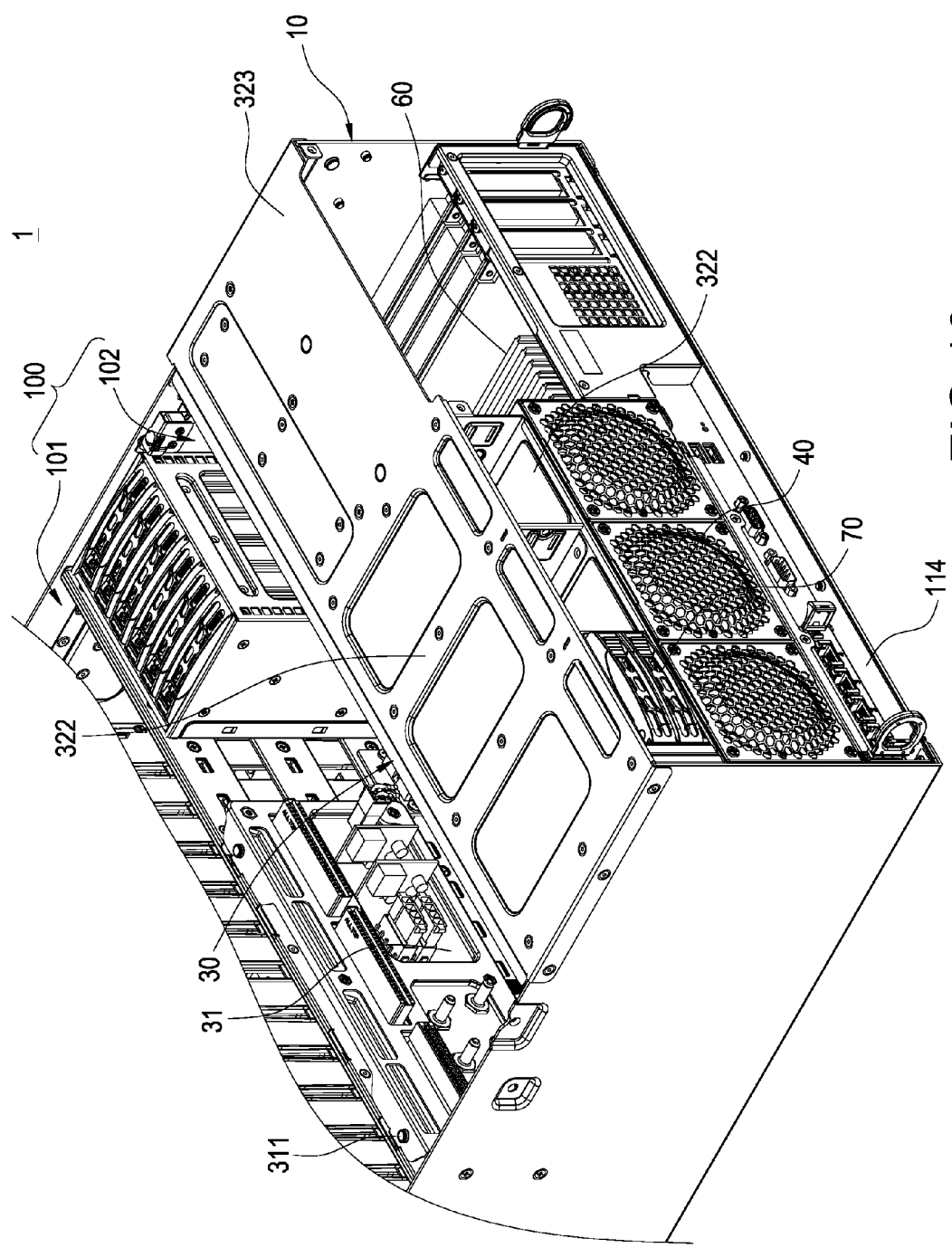
FIG. 10 is a partial exploded view of the removed movable frame of the present disclosure.

Please further refer to FIG. 10, a perspective view showing the movable frame of the present disclosure is removed. During a cable management process or maintenance process of the server 1 of the present disclosure, the movable frame 322 is removed from the system chamber 102. Furthermore, the second heat dissipation fans 50 are removed before a cable management process or a maintenance process of the peripheral device 60, and cable management and maintenance are thereby improved.

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the disclosure as defined in the appended claims.

What is claimed is:

1. A top-load HDD server for accommodating a plurality of hard disks and power supplies, the top-load HDD server comprising:
   a case comprising a plurality of support plates and a plurality of partition plates, a containing space being defined by the support plates, the partition plates being arranged in the containing space and dividing the containing space into a plurality of hard disk chambers and a system chamber, the case comprising a bottom at a bottom surface of the containing space and a top corresponding to the bottom, and the hard disks being inserted into the hard disk chambers through the top of the case;
   a mother board arranged at a bottom of the system chamber for electrically connecting with the hard disks; and
   a power supply frame comprising a power control board combined on the partition plate and a power carrier for carrying the power supply, the power control board being electrically connected with the mother board, the power carrier comprising a movable frame and a fixed frame, the movable frame being arranged above the mother board, the movable frame being combined on the power control board and removable, the fixed frame being fixed on the case, and the power supply being inserted into the fix frame and through the movable frame to electrically connected to the power control board.

2. The Top-load HDD server according to claim 1, wherein the case comprises a front side in front of the partition plates and a rear side corresponding to the front side, the hard disk chambers are adjacent to the front side of the case, the system chamber is adjacent to the rear side of the case, the movable frame and the fixed frame are arranged parallel with each other, the movable frame is arranged between the power control board and the fix frame, and the fixed frame is fixed on the rear side of the case.

3. The top-load HDD server according to claim 1, wherein a plurality of heat dissipation holes are disposed on the partition plate.

4. The Top-load HDD server according to claim 1, further comprising a plurality of first heat dissipation fans, the first heat dissipation fans being arranged in the system chamber and under the fix frame.

5. The Top-load HDD server according to claim 4, further comprising a plurality of second heat dissipation fans, the second heat dissipation fans being arranged in the system chamber and at a side of the first heat dissipation fan, an extension plate being extended from a side of the fix frame and covering above the second heat dissipation fans.

6. The Top-load HDD server according to claim 5, wherein the first heat dissipation fans and the second heat dissipation fans are arranged at the rear side of the case and upper and lower dislocation.

7. The Top-load HDD server according to claim 6, further comprising a peripheral device, and the peripheral device is arranged under the second heat dissipation fans and electrically connected to the mother board.

8. The Top-load HDD server according to claim 1, wherein a plurality of first snap holes are defined at a side of the power control board adjacent to the movable frame, a plurality of first snap columns are correspondingly arranged at the power control board, and the movable frame is connected to the power control board by snapping the first snap holes with the first snap columns.

9. The Top-load HDD server according to claim 8, wherein a plurality of second snap columns are arranged at a side of the movable frame adjacent to the fixed frame, a plurality of second snap holes are correspondingly arranged at a side of the fix frame, and the movable frame is connected to the fix frame by snapping the second snap columns to the second snap holes.

10. The Top-load HDD server according to claim 9, wherein a releasing direction of the first snap columns from the first snap hole is parallel to a releasing direction of the second snap columns from the second snap holes.

* * * * *